United States Patent
Chklovskii et al.

[11] Patent Number: 5,939,764
[45] Date of Patent: Aug. 17, 1999

[54] DIRECT CURRENT VOLTAGE TRANSFORMER

[75] Inventors: Dmitri Chklovskii, La Jolla, Calif.; Bertrand I. Halperin, Arlington, Mass.

[73] Assignee: President and Fellows of Harvard College, Cambridge, Mass.

[21] Appl. No.: 08/845,354

[22] Filed: Apr. 23, 1997

[51] Int. Cl.[6] .................................................. H01L 29/82
[52] U.S. Cl. ........................... 257/421; 257/425; 257/194
[58] Field of Search .................................. 257/421, 425, 257/192, 194, 195, 258

[56] References Cited

U.S. PATENT DOCUMENTS

| | | | |
|---|---|---|---|
| 4,488,164 | 12/1984 | Kazarinov et al. | 357/27 |
| 5,041,393 | 8/1991 | Ahrens et al. | 437/58 |
| 5,099,295 | 3/1992 | Ogawa | 357/16 |
| 5,270,557 | 12/1993 | Schmidt | 257/194 |
| 5,280,181 | 1/1994 | Saito et al. | 257/24 |
| 5,332,911 | 7/1994 | von Klitzing et al. | 257/187 |
| 5,485,018 | 1/1996 | Ogawa et al. | 257/24 |

*Primary Examiner*—Sara Crane
*Attorney, Agent, or Firm*—Choate, Hall & Stewart

[57] ABSTRACT

The DC transformer includes structure having a high mobility, two-dimensional electron gas contained within a plane therein. A magnetic field is maintained normal to the electron gas plane and the transformer structure is kept at a cryogenic temperature. Gate electrodes on the structure are biased negatively with respect to the electron gas and shaped to create a quantum point contact connecting two quantized Hall regions in the electron gas. The two regions have different quantized Hall conductivites. In one embodiment, this difference is due to different donor concentrations. Because the current is the same in the two regions, an input voltage applied across the one region will be stepped up or stepped down as measured between the output contacts to the other region.

13 Claims, 4 Drawing Sheets

DIRECT CURRENT VOLTAGE TRANSFORMER

The government may have rights in this invention pursuant to an NSF Grant No. DMR94-16910.

BACKGROUND OF THE INVENTION

The need for more powerful computers has stimulated the development of electronic components operating at high speed and low power consumption. One of the most promising technologies for future supercomputers involves the use of the superconducting electronic components which operate at cryogenic temperatures. The superconducting circuits provide very high speed and low power consumption by operating at very low voltages. These circuits have to couple to conventional semiconductor electronics at room temperatures for input/output. Therefore, there is a need for the voltage step up at the interface between superconductor and semiconductor electronics.

Conventionally, DC voltages are altered by first converting the DC to AC. The AC signal is then transformed by using conventional transformer technology. Thereafter, this AC signal, at a voltage differing from the original DC signal, is rectified resulting in a DC signal whose voltage is greater than or less than the original DC signal. Needless to say, this procedure is cumbersome and inefficient. The present invention achieves a direct change in a DC voltage without conversion to AC with a subsequent transformation and rectification.

SUMMARY OF THE INVENTION

The DC transformer according to the invention includes structure having a high mobility, two-dimensional electron gas contained within a plane therein. Gate electrodes on the structure are biased negatively with respect to the electron gas and shaped to create a quantum point contact connecting two quantized Hall regions in the electron gas. The two quantized Hall regions have different electron filling factors due to different donor concentrations. Apparatus is provided for generating a magnetic field normal to the electron gas plane and for maintaining the structure at a cryogenic temperature. Circuitry is provided for applying an input voltage across the quantized Hall regions and output contacts are spaced apart within one of the quantized Hall regions. The voltage across the output contacts is greater than or less than the input voltage.

In yet another aspect, the DC transformer of the invention includes structure having a high mobility, two-dimensional electron gas within a plane therein, and gate electrodes on the structure are biased negatively with respect to the electron gas and arranged to create two spaced apart quantum point contacts each connecting two quantized Hall regions in the electron gas. The two quantized Hall regions have different electron filling factors due to different donor concentrations. Apparatus is provided for maintaining the structure at a cryogenic temperature and for impressing a magnetic field normal to the electron gas plane. Circuitry applies an input voltage across one of the two quantized Hall regions and spaced apart output contacts are provided in the other of the two quantized Hall regions such that the voltage across the output contacts is greater than or less than the input voltage.

In yet another aspect of the invention, a second gate electrode is provided on the structure and is biased negatively with respect to the electron gas. The second gate electrode is adapted to establish different electron densities in two quantized Hall regions. In this embodiment, there need not be different donor concentrations within the structure.

In preferred embodiments, the cryogenic temperature is less than 1K and the magnetic field is greater than 1 Tesla. It is also preferred that the structure be multilayer with the two-dimensional electron gas residing in an interfacial region between two of the layers. In one embodiment, there are GaAs, AlGaAs, n-doped AlGaAs and GaAs layers. It is also preferred that the gate electrodes be separated from one another at the point of closest approach by approximately 0.5 $\mu$m which creates a neck in the electron gas of approximately the magnetic length.

In one embodiment, the two quantized Hall regions have states with $\upsilon=1$ and $\upsilon=\frac{1}{3}$ where p is the electron filling factor. In this embodiment, the voltage across the output contacts will be approximately three times the input voltage. Several of these devices may be connected in series in order to obtain still higher multiplication factors for the voltage. If desired, several devices may be placed in parallel in order to increase the current that can be carried at a given voltage. If the input and output leads are interchanged on this device, the output leads will have a smaller voltage than the input, but will carry a greater current.

DESCRIPTION OF THE PREFERRED EMBODIMENT

First of all, the theory on which the present invention is based will be discussed in detail.

It has long been understood that quantized Hall states with different Hall conductances cannot be connected adiabatically in the interior of a macroscopic two-dimensional electron system. For a pure system, where the quantized Hall states have energy gaps, the boundary between two quantized states must be characterized by a vanishing energy gap, with associated low energy excitations. In a disordered system there are generally localized low energy excitations in the interior of a quantized Hall region, which then become extended at the boundary between two quantized regions. The possible transitions between different quantized Hall states have been elucidated (in the case of a fully spin-polarized system) by the introduction of a "global phase diagram" based on a unitary transformation which introduces a Chern-Simons gauge field and which, at the mean field level, maps fractional quantized Hall states onto integer ones. S. Kivelson, D. -H. Lee. and S. -C. Zhang, Phys. Rev. B 46, 2223 (1992); B. I. Halperin, P. A. Lee, and N. Read, Phys. Rev. B 47, 7312 (1993).

In a narrow quantum wire, however, there can be an adiabatic transition between two different quantized Hall states, under certain conditions. An important example is the case of a transition between states with $\upsilon=1$ and $\upsilon=\frac{1}{3}$ where p is the electron fig factor. It should be noted that for both of these states, there is a single edge mode at a sharp sample boundary, X. -G. Wen, Int. J. of Mod. Phys. B 6, 1711 (1992), so one can have a single pair of oppositely moving modes running continuously through the transition region. We shall discuss the transition between the two states in a narrow wire using a fermion-Chern-Simons mean-field description, B. I. Halperin, P. A. Lee, and N. Read, Phys. Rev. B 47, 7312 (1993); J. Jain, Adv. Phys. 41, 105 (1992), in which the effective magnetic field changes sign in the transition region, and using a bosonized Luttinger liquid formalism, in which the interaction coefficient g is allowed to vary continuously within the transition region. The existence of an adiabatic junction between the two quantized Hall regions allows construction of a DC step-up or step-down transformer, where the output voltage is larger or smaller than the input voltage supplied by the power source.

Figure 1:
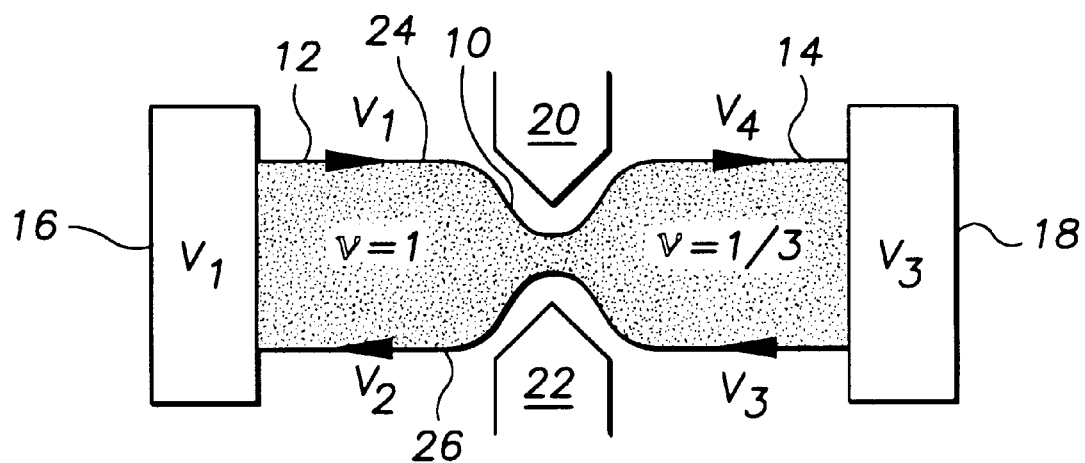
FIG. 1 is a schematic illustration of a junction connecting quantum Hall states.

Consider the geometry illustrated in FIG. 1 where there is a narrow wire (or "point contact") 10 connecting two macroscopic quantized Hall regions 12, 14, with different electron densities corresponding to $\upsilon=1$ and $\upsilon=\frac{1}{3}$ respectively. We assume that each of the edges is sufficiently long that local thermal equilibrium is established on the edge at a voltage labeled $V_j$ where j=1 and j=2 denote, respectively, the incoming and outgoing channels on the $\upsilon=1$ side of the junction, and j=3 and j=4 denote the incoming and outgoing channels on the v=$\frac{1}{3}$ side. We also assume that the external current contracts 16, 18 are "ideal" so $V_1$ and $V_3$ are equal to the voltages in the leads (not shown). See, e.g., C. W. J. Beenakker and H. van Houten, in *Solid State Physics*, edited by H. Ehrenreich and D. Turnbull (Academic, New York, 1991), Vol. 44. Quantum point contact is produced by a narrow neck formed by electrodes 20 and 22 separated on the order of a magnetic length. Arrows 24, 26 show the direction of edge states.

If the voltages of the external leads (not shown) are equal to each other, then the system will be in global thermal equilibrium, with all $V_j$ being equal. More generally if $V_1-V_3$ is sufficiently small, the voltages $V_2$ and $V_4$ win be linear functions of $V_1$ and $V_3$, and we may write $$V_2=\alpha V_1+(1-\alpha)V_3, \quad (1)$$

$$V_4=\beta V_1+(1-\beta)V_3, \quad (2)$$

where $\alpha$ and $\beta$ depend on the characteristics of the connecting junction, including, in general, the temperature T.

The current on edge j is given by $I_j=\upsilon_j V_j(e^2/h)$, and the energy flux along the edge is $I_j V_j/2$. Thus current conservation through the junction requires that $$\beta=(1-\alpha), \quad (3)$$

while the requirement that the outgoing power be equal to or less than the power incident on the junction implies $$\frac{1}{2} \leq \alpha \leq 1 \quad (4)$$

The two limiting situations, where there is no energy loss in the junction region, are $\alpha=1$, $\beta=0$, which corresponds to zero current transmission through the junction, and $\alpha=\frac{1}{2}$, $\beta=\frac{3}{2}$, which is what we mean by an "adiabatic junction." A similar analysis for a different situation has been done by X. G. Wen, *Phys. Rev. B*, 50, 5420 (1994). The more familiar case of a wide junction, where equilibration is established along a relatively long boundary separating bulk regions with $\upsilon=1$ and $\upsilon=\frac{1}{3}$, corresponds to parameters $\alpha=\frac{2}{3}$, $\beta=1$, which is not dissipationless.

If we set $V_3=0$, and supply a small voltage $V_1$, to the other current lead, then a voltmeter connected between the opposite edges of the $\upsilon=\frac{1}{3}$ wire will measure the voltage $V_4=\beta V_1$. Moreover, the two-terminal conductance G, defined as the ratio between the current I in the leads and the input voltage $V_1$, is given by $$G=\beta e^2/3h. \quad (5)$$

If we can construct a junction with $\beta>1$, then we can obtain a voltage $V_4$ which is larger than the input voltage, and we obtain $G>e^2/3h$. This last result violates the common belief that the two terminal conductance of a quantum Hall system is always less than the bottleneck with lowest conductance, as the two-contact resistance of ideal leads connected to a single $\upsilon=\frac{1}{3}$ region would be $e^2/3h$. This also emphasizes an important point made by several authors that the question of conductance is subtle and should be formulated with a definite experimental arrangement in mind. K. A. Matveev, private communications; D. L. Maslov and M. Stone, Phys. Rev. B 52, 5539 (1995); A. Yu. Alekseev, V. V. Cheianov, and J. Fröhlich, preprint, cond-mat/9607144.

Figure 2:
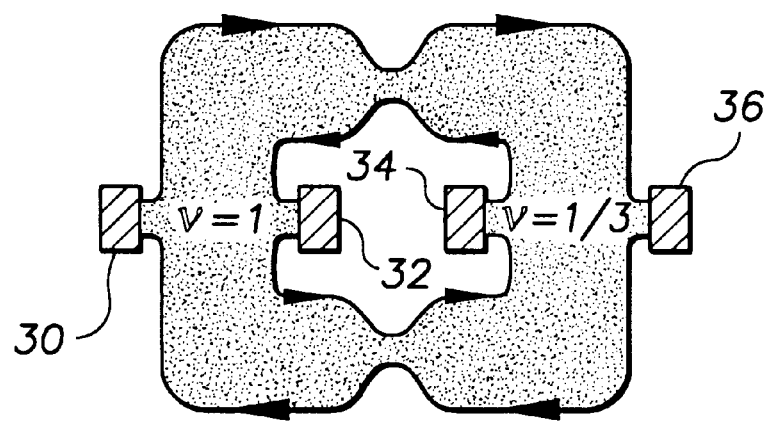
FIG. 2 is a schematic illustration of a DC transformer in a ring geometry.

A more efficient voltage-transformer may be realized with the ring geometry illustrated in FIG. 2. If a battery (not shown) with voltage V is connected to ideal current contacts at points 30 and 32, and a load with resistance R is connected to points 34 and 36, then if the junctions between the regions of $\upsilon=1$ and $\upsilon=\frac{1}{3}$ are perfectly adiabatic ($\beta=\frac{3}{2}$), the voltage across the load resistor will be equal to $3V/(1+12h/e^2R)$. When R=$\infty$, this device draws no current from the battery, and the output voltage is 3V. More generally, the output current is one-third of the input current. If $R>12h/e^2$, the output voltage is close to 3V, and the power lost in the transformer is small compared to the power delivered to the load.

To demonstrate the possibility of an adiabatic junction between $\upsilon=\frac{1}{3}$ and $\upsilon=1$ states, we first use the fermion-Chern-Simons approach. B. I. Halperin, P. A. Lee, and N. Read, Phys. Rev. B 47, 7312 (1993);J. Jain, Adv. Phys. 41, 105 (1992). In the mean field approximation the $\upsilon=\frac{1}{3}$ state is viewed as a completely filled Landau level for composite fermions. This also holds for the $\upsilon=1$ state except that the effective magnetic field is opposite to the direction of the external magnetic field. Therefore, a narrow wire at either filling factor with sufficiently sharp boundaries can be described in the Landau gauge by a single energy band with two chiral edge channels. The two filling factors can be easily distinguished in a wire much wider than the magnetic length. In particular, the local electron density is three times greater in the $\upsilon=1$ state. However, when the width of the wire is of the order of the magnetic length the distinction between the two states disappears. Then the density is not a good way to differentiate between the states. In fact, on the mean field level the two states look almost identical.

The transition between the two states can be carried out in the following way. On one side we have a wide $\upsilon=1$ state with a single energy band in the Landau gauge. The wire is then narrowed gradually on the scale of the magnetic length. When the width of the wire is of the order of the magnetic length the energy spectrum is mainly determined by the confinement potential rather than magnetic field. Therefore reducing the effective magnetic field along the wire by reducing the density should not change radically the energy spectrum. Higher composite fermion energy bands corresponding to other fractions remain unfilled so that there is a single pair of edge channels. As the filling factor is reduced below $\frac{1}{2}$ the effective magnetic field changes sign and is slowly brought to its $\upsilon=\frac{1}{3}$ value. Then the wire is widened and represents a well-defined $\upsilon=\frac{1}{3}$ state.

Although the composite fermion analysis can be extended to find the chemical potentials of edge channels, D. B.

Chklovskii and B. I. Halperin, in preparation, we take a different approach here. It has been argued by several authors, M. Stone and M. P. A. Fisher, Int. J. of Mod. Phys. B, 8, 2539 (1994), and A. Yu Aleksev, V. V. Cheianov, and J. Fröhlich, preprint, cond-mat/9607144, that a quantum wire with filling factor υ=1 or υ=⅓ can be modeled by a Luttinger Hamiltonian of the form:

$$H = \frac{\hbar}{4\pi}\int_{-\infty}^{+\infty} v_F dx \left[ \left(\frac{d\phi_L}{dx}\right)^2 + \left(\frac{d\phi_R}{dx}\right)^2 + \frac{g}{2}\left(\frac{d\phi_L}{dx} + \frac{d\phi_R}{dx}\right)^2 \right] \quad (6)$$

We define charge-density operators $\rho_j$ by $d\phi_j/dx = 2\pi\rho$ and we assume commutation relations $$[\phi_j(x), \phi_{j'}(x')] = (-1)^j i\pi sgn(x-x')\delta_{jj'}, \quad (7)$$

where j=1,2 refers to the indices R and L, respectively.

In the υ=1 state the density operators $\rho_j$ correspond to the real electron density at a given edge, and g=0 for a sufficiently wide wire. In the υ=⅓ state, however, the physical density at a given edge is a linear combination of $υ_j$, and g=8. By choosing fields $\phi_j$ which are corresponding linear combinations of $\phi_j$ one can get rid of the cross-term in the Hamiltonian and express it in terms of decoupled edge excitations, as we shall see explicitly below. Therefore, the presence of nonzero g does not necessarily imply interaction between the two edges but rather the effective mixing of modes. The general relation between g and the filling factor valid for the simplest fractions, with a single edge state, is:

$$\upsilon = (1+g)^{-1/2}, \quad (8)$$

where $\upsilon^{-1}$ must be an odd integer. X.-G. Wen, Int. J. of Mod. Phys. B 6, 1171 (1992).

We take this idea further and postulate that the transition region between the two regions with $g_1$ and $g_2$ can also be described by the Luttinger Hamiltonian (6) with $g=g_1$ for $x<-L/2$, $g=g_2$ for $x>L/2$ and g varying continuously from $g_1$ to $g_2$ for $-L/2<x<L/2$. This is a natural consequence of the fact that if the translational invariance is not spontaneously broken in the wire and the conditions in the wire are changed adiabatically then there are two chiral boson modes running in opposite directions.

By using commutation relations (7) with the Hamiltonian we get the following equations of motion:

$$\begin{cases} \frac{d\phi_L}{dt} = -v_F\left[\left(1+\frac{g}{2}\right)\frac{d\phi_L}{dx} + \frac{g}{2}\frac{d\phi_R}{dx}\right] \\ \frac{d\phi_R}{dt} = v_F\left[\left(1+\frac{g}{2}\right)\frac{d\phi_R}{dx} + \frac{g}{2}\frac{d\phi_L}{dx}\right] \end{cases} \quad (9)$$

where g and $v_F$ are functions of x. The solution of these equations depends on the particular form of g. However, there are two limits when they can be solved exactly, independent of the way g varies in the transition region. (Cf. Y. Oreg and A. Finkelstein (Phys. Rev. Lett. 74, 3668 (1995)) who consider a related problem of a υ=1 strip with a position-dependent interaction.) The first limit is when the wavelength λ of the incoming pulse is smaller that the length L of the transition region. In this case the solution can be found by making a Bogoliubov transformation to chiral modes, which correspond to the density waves confined to a single edge:

$$\begin{cases} \tilde{\phi}_L = \frac{1}{2}(1 + 1/\sqrt{1+g})\phi_L + \frac{1}{2}(1 - 1/\sqrt{1+g})\phi_R \\ \tilde{\phi}_R = \frac{1}{2}(1 - 1/\sqrt{1+g})\phi_L + \frac{1}{2}(1 + 1/\sqrt{1+g})\phi_R \end{cases} \quad (10)$$

Substituting this in the equations of motion and neglecting the variation in g on the length of the pulse we find:

$$\frac{d\tilde{\phi}_j}{dt} = (-1)^j v_F \sqrt{1+g}\frac{d\tilde{\phi}_j}{dx} \quad (11)$$

Solutions of these equations are chiral waves, which implies that a short density pulse goes through the transition region without any reflection. Cf. Y. Oreg and A. Finkel'stein (Phys. Rev. Lett. 74, 3668 (1995)).

The other limit is when the wavelength λ of the incoming pulse is greater than the length L of the transition region. Then we can solve the problem separately in the two regions and then match the solutions assuming that the transition region is infinitely short. The chiral wave solutions are found for the transformed variables $\phi_L$ and $\phi_R$ with the values of g in Eq. 10 corresponding to the particular regions. The continuity of the $\phi_j$ requires that these fields are equal on the two sides of the transition.

We formulate a scattering problem by forming an incoming wave with a current of unit amplitude from the filling factor $υ_1$ side. Then the current in the reflected wave is given by the reflection coefficient r and the transmitted wave by the transmission coefficient t. We find the current reflection and transmission coefficients:

$$t = 2v_2/(υ_1+υ_2) \quad (12)$$

$$r = (v_1-v_2)/(v_1+v_2) \quad (13)$$

where $υ_1$ and $υ_2$ are related to $g_1$ and $g_2$ according to Eq. (8). It is easy to see that these coefficients satisfy the law of current conservation: r+t=1. It also satisfies the law of energy conservation. In fact the coefficients can be obtained from these two conditions. For the particular values $υ_1$=1, $υ_2$=⅓, we find that the reflection coefficient is ½. If the incoming wave originates from the filling factor ⅓ side ($υ_1$=⅓, $υ_2$=1), the reflection coefficient is -½. Minus implies that the reflected pulse has the opposite sign of density. The transmission coefficient is 3/2 in this case, which may appear to be a very unusual result. However, this is similar to a wave reflection in a classical string with an impedance discontinuity, Berkeley Physics Course, vol.3-Waves, F. S. Crawford, p.234, the impedance being the inverse of the filling factor. These results were derived for Luttinger liquid in a zero magnetic field in I. Safi and R. Schulz, *Phys. Rev. B.*, 52, 17040 (1995). (Our result for t differs from the related Eq.(10) of the Y. Oreg. And A. Finkelstein reference due to a difference in definitions and an apparent typographical error.)

Knowing the reflection coefficients for the currents also allows us to find edge state chemical potentials on the two sides of the transition for DC transport. Let us send an infinite wavelength pulse from the υ=1 side with a current such that the voltage on that edge is $V_1$ and a pulse from the υ=⅓ with voltage $V_3$. Then the outgoing currents can be found from Eqs. (12,13). The voltages on the outgoing channels are seen to obey Eqs. (1,2), with α=½, β=3/2.

Next, we consider the effects of disorder. An impurity, or an irregularity in the confining potential, at point x in the narrow-neck region can give rise to backscattering, through a term in the Hamiltonian of form $$H' = \gamma exp[i\phi_L(x)+i\phi_R(x)]+h.c. \tag{14}$$

The phase of the coefficient $\gamma$ will depend on the position x, and its magnitude will depend sensitively on the width of the strip at that point. The amplitude will be very small if x is in a wide region, as there will then be little overlap between the wavefunctions for states on opposite edges of the wire.

The resistance due to backscattering is proportional to $|\gamma|^2$, if $|\gamma|$ is small. According to the standard renormalization group analysis, however, for a wire of constant width, if g>0, the value of $|\gamma|$ will increase with decreasing energy scale. Specifically, for voltages sufficiently small so that one is in the linear regime, the backscattering resistance of a wire should vary as $T^{-y}$, with (X. -G. Wen, Int. J. of Mod. Phys. B 6, 1171 (1992); C. Kane and M. P. A. Fisher, Phys. Rev. B 46, 15233 (1992)).

$$y = 2 - \frac{2}{\sqrt{1+g}} \tag{15}$$

For the present situation, where g varies with x, if the temperature is sufficiently high that the thermal length scale $h\upsilon_F/k_BT$ is small compared to the size L of the transition region, Eq. (15) still holds, with g evaluated at the position of the impurity. The value of y obtained in this way would be intermediate between the values y=0 and y=2 that correspond to uniform quantum Hall strips with $\upsilon=1$ and $\upsilon=\frac{1}{3}$ respectively. If the temperature is sufficiently low that the thermal length is large compared to L, however, then we find, from a normal-mode analysis (D. B. Chklovskii and B. I. Halperin, in preparation) that the exponent y becomes equal to 1, independent of the precise location x of the scatterer. (If the voltage V is large compared to $k_BT/e$, then the temperature T should be replaced by $eV/k_B$. then the temperature T should be replaced by $eV/k_B$ throughout the previous discussion.) In any case, we find that the adiabatic fixed point, where $\beta=\frac{3}{2}$ and there is no backscattering, is unstable, according to a Luttinger-liquid analysis, so that any non-zero value of $(\frac{3}{2}-\beta)$ will grow with decreasing temperature and voltage. Thus, to observe the effect of voltage amplification, one must fabricate a junction with a value of $(\frac{3}{2}-\beta)$ as close as possible to zero, and then make the measurement at a temperature which is not too low.

There are several requirements for the implementation of the DC transformer of the invention. First, the quantum point contacts must be approximately a magnetic length wide yet adiabatic. Second, the edges of the $\upsilon=1$ and $\upsilon=\frac{1}{3}$ states must be sufficiently sharp to support only a single edge channel.

In order to make the junction as close as possible to adiabatic, one would like to avoid any roughness in the confining potential, as well as impurities, which could lead to backscattering. One must also consider, however, the possibility of an abrupt change in the electron density or its profile across the width of the wire that could occur due to a spontaneously-formed domain wall, if the electron system goes through a first-order phase transition in the neck region.

Although we do not find any symmetry change between the $\upsilon=\frac{1}{3}$ and $\upsilon=1$ states in a narrow wire, one cannot rule out the possibility of having several phases separated by first-order transitions. In fact, exact-diagonalization studies of systems with up to six electrons in a narrow wire suggest that there might be several distinct phases, separated by sharp transitions, between the densities which correspond to $\upsilon=1$ and $\upsilon=\frac{1}{3}$. D. Yoshioka, Physica B 184, 86 (1993); T. Chakraborty, K. Niemelä, and P. Pietiläinen, preprint. (The calculated states have different density profiles across the wire, corresponding roughly to phases with one, two or three distinct rows of atoms.)

Even if there is a sharp transition in a long wire, however, it might be possible to obtain a smooth transition in a properly engineered point contact. Moreover, it is possible in principle to cancel the reflected amplitude from one density-discontinuity with a wave reflected by a second discontinuity or by an impurity placed at an appropriate position, using destructive interference. Such a complicated structure may be difficult to achieve by design, but might occur naturally in some fraction of samples due to random fluctuations during fabrication.

Figure 3:
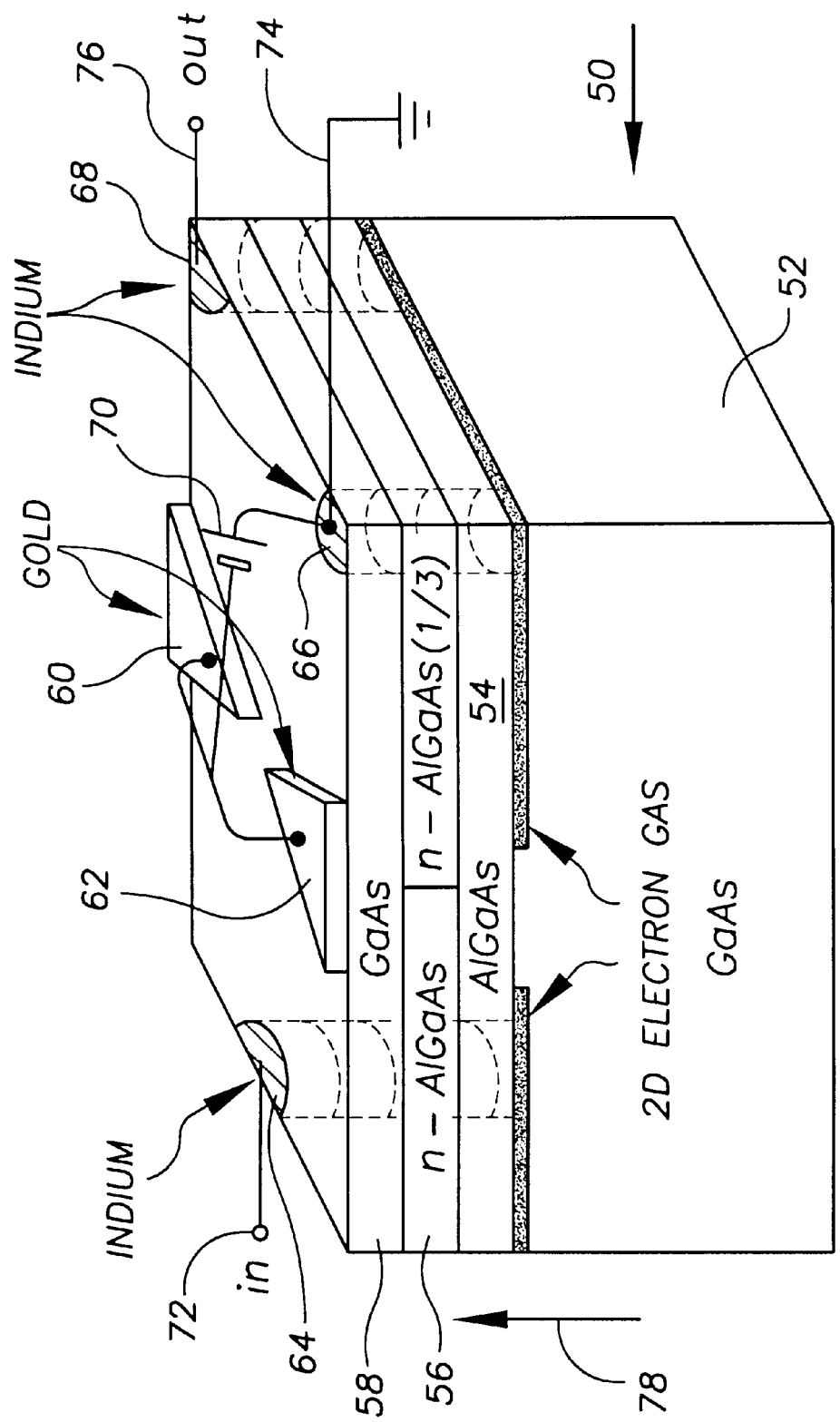
FIG. 3 is a perspective view of an embodiment of the transformer of the invention.

With reference to FIG. 3, a transformer 50 according to the invention includes a gallium arsenide substrate layer 52 grown using molecular beam epitaxy. On the layer 52 is grown an aluminum gallium arsenide spacer layer 54. On the layer 54 is disposed a layer 56 of n-doped aluminum gallium arsenide which is modulation doped such that the donor concentration on the right side in FIG. 3 is $\frac{1}{3}$ of that on the left side of FIG. 3. A layer 58 of gallium arsenide is disposed on the layer 56. Gold gate electrodes 60 and 62 reside on the top surface of the cap layer 58 and are configured as shown to create a quantum point contact between the gate electrodes 60 and 62. Indium contacts 64, 66 and 68 are also deposited on the layer 58. The structure is heated such that the indium diffuses downwardly through layers 58, 56 and 54 to provide electrical contact with the two-dimensional electron gas contained in the interface between layers 52 and 54. A voltage source 70 negatively biases the electrodes 60 and 62 with respect to the two-dimensional electron gas. A voltage applied between a contact 72 and a grounded contact 74 will be stepped up when measured between the contact 74 and an output contact 76. In this configuration, the voltage between the contacts 74 and 76 will be approximately one and one-half times the voltage at 72. A magnetic field oriented in the direction of the arrow 78 is provided across the structure 50. A suitable magnetic field is greater than 1 Tesla. As discussed above, the structure 50 is maintained at a cryogenic temperature such as less than 1K.

Figure 4:
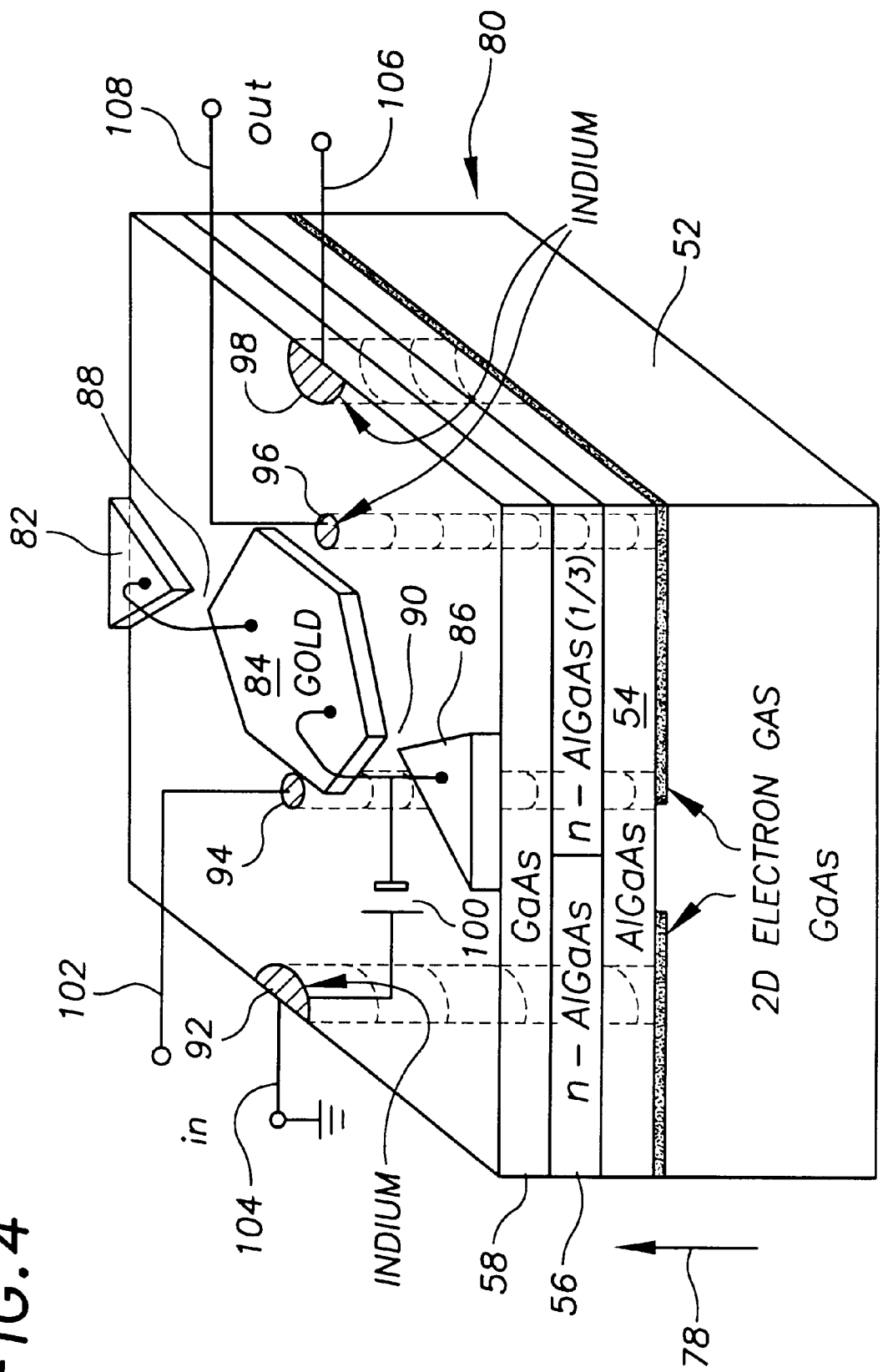
FIG. 4 is a perspective view of another embodiment of the transformer of the invention.

With reference to FIG. 4, another embodiment 80 of the invention includes gate electrodes 82, 84 and 86 disposed on the layer 58. The gate electrodes 82 and 84 form a quantum point contact 88 and the gate electrodes 84 and 86 form a quantum point contact 90. Indium contacts 92, 94, 96 and 98 provide for electrical contact with the two-dimensional electron gas. A voltage source 100 negatively biases the gate electrodes with respect to the two-dimensional electron gas. A DC voltage applied between input contacts 102 and 104 is stepped up as measured between output contacts 106 and 108. In this configuration, the output voltage will be approximately three times the input voltage. As in the embodiment of FIG. 3, the structure 80 of FIG. 4 is situated within a magnetic field in the direction of the arrow 78 and the structure is maintained at a cryogenic temperature. Note that the configuration in FIG. 3 is a physical implementation of the schematic embodiment of FIG. 1 and the configuration of FIG. 4 is a physical implementation of the schematic embodiment of FIG. 2.

Figure 5:
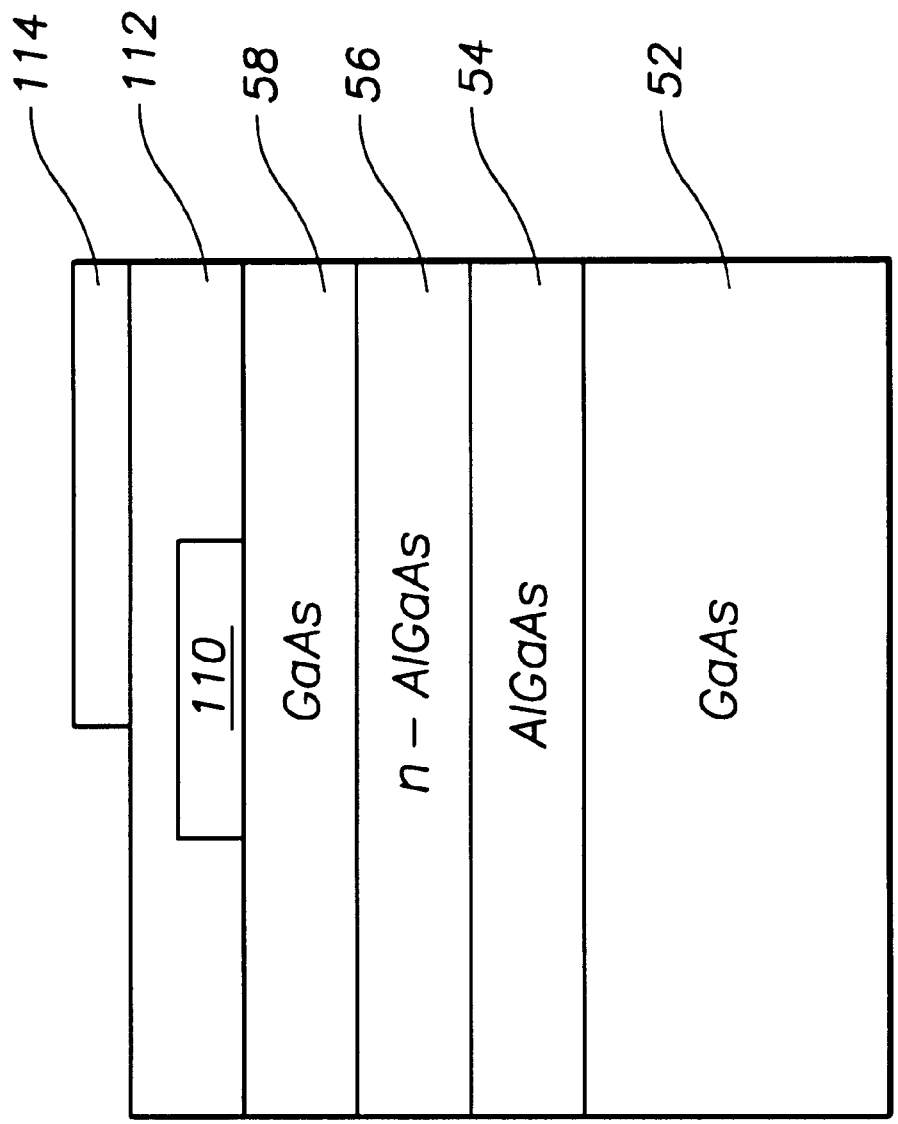
FIG. 5 is a schematic, cross-sectional view of yet another embodiment of the invention.

Yet another embodiment of the invention is shown in FIG. 5. In this embodiment, a first gate electrode 110 is disposed on the gallium arsenide layer 58. The gate electrode 110 creates a quantum point contact. An insulating layer 112 made of an insulating oxide is disposed over the layer 58. A second gate electrode 114 is disposed on the insulating layer 112. Both the first gate electrode 110 and the second gate electrode 114 are biased negatively with respect to a two-dimensional electron gas in the interface between layers 52 and 54. In this embodiment, the layer 56 need not be modulation doped in that the second gate electrode 114 will establish different electron densities in the quantized Hall regions.

It should be recognized that filling factors other than $\upsilon=\frac{1}{3}$ such as $\upsilon=\frac{1}{5}$, $\frac{1}{7}$ and $\frac{1}{9}$ can be utilized to achieve even greater voltage step-up.

It is recognized that modifications and variations of the present invention will occur to those skilled in the art and it is intended that all such modifications and variations be included within the scope of the appended claims.

What is claimed is:

1. A DC transformer comprising:

structure including a high mobility, two-dimensional electron gas contained within a plane therein;

gate electrodes on the structure biased negatively with respect to the electron gas and shaped to create a quantum point contact connecting two quantized Hall regions in the electron gas, the two quantized Hall regions having different donor concentrations;

means for generating a magnetic field normal to the electron gas plane and means for maintaining the structure at a cryogenic temperature;

means for applying an input voltage across the quantized Hall regions; and output contacts spaced apart within one of the quantized Hall regions, the voltage across the output contacts being greater than or less than the input voltage.

2. A DC transformer comprising:

structure including a high mobility, two-dimensional electron gas contained within a plane therein;

gate electrodes on the structure biased negatively with respect to the electron gas and arranged to create two spaced apart quantum point contacts each connecting two quantized Hall regions in the electron gas, the two quantized Hall regions having different donor concentrations;

means for generating a magnetic field normal to the electron gas plane and means for maintaining the structure at a cryogenic temperature;

means for applying an input voltage across one of the two quantized Hall regions; and spaced apart output contacts in the other of the two quantized Hall regions, the voltage across the output contacts being greater than or less than the input voltage.

3. A DC transformer comprising:

structure including a high mobility, two-dimensional electron gas contained within a plane therein;

first gate electrodes on the structure biased negatively with respect to the electron gas and shaped to create a quantum point contact connecting two quantized Hall regions in the electron gas;

a second gate electrode on the structure biased negatively with respect to the electron gas and adapted to establish different electron densities in the two quantized Hall regions;

means for generating a magnetic field normal to the electron gas plane and means for maintaining the structure at a cryogenic temperature;

means for applying an input voltage across the quantized Hall regions; and output contacts spaced apart within one of the quantized Hall regions, the voltage across the output contacts being greater that or less than the input voltage.

4. A DC transformer comprising:

structure including a high mobility, two-dimensional electron gas within a plane therein;

first gate electrodes on the structure biased negatively with respect to the electron gas and arranged to create two spaced-apart quantum point contacts each connecting two quantized Hall regions in the electron gas;

a second gate electrode on the structure biased negatively with respect to the electron gas and adapted to establish different electron densities in the two quantized Hall regions;

means for generating a magnetic field normal to the electron gas plane and means for maintaining the structure at a cryogenic temperature;

means for applying an input voltage across one of the two quantized Hall regions; and spaced-apart output contacts in the other of the two quantized Hall regions, the voltage across the output contacts being greater than or less than the input voltage.

5. The transformer of claims 1, 2, 3 or 4 wherein the cryogenic temperature is less than 1K.

6. The transformer of claims 1, 2, 3 or 4 wherein the magnetic field is greater than 1 Tesla.

7. The transformer of claims 1, 2, 3 or 4 wherein the structure comprises a multilayer configuration with the two-dimensional electron gas residing in the interfacial region between two of the layers.

8. The transformer of claim 7 wherein the electron gas resides between a gallium arsenide layer and an aluminum gallium arsenide layer.

9. The transformer of claim 1 or claim 2 wherein the first gate electrodes are separated from one another at the point of closest approach by approximately 0.5 $\mu$m.

10. The transformer of claim 1 or claim 2 wherein the first gate electrodes are separated from one another at the point of closest approach by approximately a magnetic length.

11. The transformer of claims 1, 2, 3 or 4 wherein the two quantized Hall regions have states with $\upsilon=1$ and $\upsilon=\frac{1}{3}$ where $\upsilon$ is an electron filling factor.

12. The transformer of claims 1, 2, 3 or 4 wherein the voltage across the output contacts is greater than the input voltage.

13. The transformer of claim 12 wherein the across the output contacts is approximately three times the input voltage.

* * * * *